(12) United States Patent
Park et al.

(10) Patent No.: US 9,356,167 B2
(45) Date of Patent: May 31, 2016

(54) SEMICONDUCTOR ULTRAVIOLET (UV) PHOTO-DETECTING DEVICE

(71) Applicant: Seoul Viosys Co., Ltd., Ansan-si (KR)

(72) Inventors: Ki Yon Park, Ansan-si (KR); Hwa Mok Kim, Ansan-si (KR); Kyu Ho Lee, Ansan-si (KR); Sung Hyun Lee, Ansan-si (KR); Hyung Kyu Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/584,732

(22) Filed: Dec. 29, 2014

(65) Prior Publication Data
US 2015/0115318 A1  Apr. 30, 2015

Related U.S. Application Data

(63) Continuation-in-part of application No. 14/496,998, filed on Sep. 25, 2014, now Pat. No. 9,171,986.

(30) Foreign Application Priority Data

Sep. 25, 2013  (KR) .................. 10-2013-0113854
Dec. 27, 2013  (KR) .................. 10-2013-0165878

(51) Int. Cl.
| | |
|---|---|
| *H01L 31/0328* | (2006.01) |
| *H01L 31/0336* | (2006.01) |
| *H01L 31/072* | (2012.01) |
| *H01L 31/109* | (2006.01) |
| *H01L 31/0304* | (2006.01) |
| *H01L 31/11* | (2006.01) |
| *H01L 31/108* | (2006.01) |
| *H01L 31/18* | (2006.01) |

(52) U.S. Cl.
CPC .... *H01L 31/03048* (2013.01); *H01L 31/03044* (2013.01); *H01L 31/108* (2013.01); *H01L 31/11* (2013.01); *H01L 31/1848* (2013.01); *H01L 31/1856* (2013.01)

(58) Field of Classification Search
CPC ............... H01L 31/02021; H01L 31/1013; H01L 31/03046; H01L 31/03048
USPC ....................................................... 257/183
See application file for complete search history.

(56) References Cited

U.S. PATENT DOCUMENTS

2014/0183549 A1*  7/2014  Park ................ H01L 31/1013
                                                           257/76

FOREIGN PATENT DOCUMENTS

| KR | 10-2006-0112428 | 11/2006 |
|---|---|---|
| KR | 10-2009-0062348 | 6/2009 |
| KR | 1020100104997 | 9/2010 |

OTHER PUBLICATIONS

Notice of Allowance issued on Aug. 5, 2015, in U.S. Appl. No. 14/496,998.
Notification of Reason for Refusal issued on Dec. 14, 2015 in Korean Patent Application No. 10-2013-0165878.

\* cited by examiner

*Primary Examiner* — Hoai V Pham
(74) *Attorney, Agent, or Firm* — H.C. Park & Associates, PLC

(57) ABSTRACT

An ultraviolet (UV) photo-detecting device, including: a first nitride layer; a secondary light absorption layer disposed on the first nitride layer; a primary light absorption layer disposed on the secondary light absorption layer; and a Schottky junction layer disposed on the primary light absorption layer. The secondary light absorption layer includes a nitride layer having lower band-gap energy than the primary light absorption layer.

13 Claims, 5 Drawing Sheets

SEMICONDUCTOR ULTRAVIOLET (UV) PHOTO-DETECTING DEVICE

CROSS-REFERENCE TO RELATED APPLICATIONS

This application is a continuation-in-part of U.S. patent application Ser. No. 14/496,998, filed on Sep. 25, 2014, and claims priority from and the benefit of Korean Patent Application No. 10-2013-0113854, filed on Sep. 25, 2013, and Korean Patent Application No. 10-2013-0165878, filed on Dec. 27, 2013, each of which is incorporated by reference for all purposes as if fully set forth herein.

BACKGROUND

1. Field

Exemplary embodiments relate to a semiconductor photo-detecting device. More particularly, exemplary embodiments relate to a semiconductor photo-detecting device with excellent detection efficiency for a specific wavelength of light.

2. Discussion of the Background

Semiconductor photo-detecting devices operate on the principle that current is induced by illuminated light. In particular, semiconductor photo-detecting devices for detecting ultraviolet (UV) light may be used in a variety of fields, such as business, medical science, defense industry, communications, etc. The semiconductor photo-detecting devices are based on the principle that a depletion region is formed by the separation of electrons and holes within a semiconductor upon absorption of photons, and current is, thus, induced depending upon a flow of the electrons.

Semiconductor photo-detecting devices using silicon have been typically used in the art. However, the semiconductor photo-detecting devices may require high voltage for operation and have low detection efficiency. Particularly, when the semiconductor photo-detecting devices for detecting UV light are manufactured using silicon, photo-detection efficiency may decrease due to the silicon being sensitive not only to UV light but also to visible and infrared light. In addition, UV light detecting devices using silicon may be thermally and chemically unstable.

To address such issues, photo-detecting devices using nitride-based semiconductors have been developed. Photo-detecting devices using nitride-based semiconductors may have relatively high responsivity, high reaction rate, low noise level, and high thermal and chemical stability compared with photo-detecting devices using silicon. Photo-detecting devices using AlGaN, among nitride-based semiconductors, as a light absorption layer may show improved characteristics as a UV light detecting device.

Nitride-based semiconductor photo-detecting devices may be manufactured in a variety of structures, such as, photoconductors, Schottky junction photo-detecting devices, p-i-n photo-detecting devices, and the like. Among the various forms of nitride-based semiconductor photo-detecting devices, Schottky junction photo-detecting devices may include a substrate, a buffer layer on the substrate, a light absorption layer on the buffer layer, and a Schottky junction layer on the light-absorption layer. Further, a first electrode and a second electrode may be arranged on the Schottky junction layer and the buffer layer or the light-absorption layer, respectively. To use the Schottky junction photo-detecting device as a UV light detecting device, the light absorption layer may be formed of a nitride-based semiconductor having band gap energy capable of absorbing UV light. Accordingly, AlGaN may be used as a semiconductor substance in the light-absorption layer. A GaN layer may be used as the buffer layer.

In a structure including an AlGaN light absorption layer and a GaN buffer layer, when the AlGaN light absorption layer has an Al composition of 25% or more, or a thickness of 0.1 μm or more, cracks may be generated in the light absorption layer, thereby causing a yield decrease. To prevent cracking in the light-absorption layer, an AlN layer may be interposed between the GaN buffer layer and the AlGaN light absorption layer. Even in this case, photo-detection response may be reduced due to high energy band gap and insulation characteristics of the AlN layer. Specifically, when the thickness of the AlN layer is less than about 100 Å, photo-detection characteristics may be improved but it may be difficult to completely prevent cracks, and when the thickness of the AlN layer exceeds about 100 Å, cracks may be prevented, but photo-detection characteristics may be deteriorated.

In addition, GaN, InGaN, and AlGaN layers used as a light absorption layer in typical nitride-based semiconductor photo-detecting devices may have intrinsic defects and allow current flow in the devices in response to visible light, but not UV light due to such defects. In response, characteristics of the semiconductor photo-detecting device, a low UV-to-visible rejection ratio of about 103 has been measured. That is, the typical semiconductor photo-detecting devices may allow low current flow in response to visible light but not UV light, thereby, deteriorating detection accuracy.

The above information disclosed in this Background section is only for enhancement of understanding of the background of the inventive concept, and therefore, it may contain information that does not form any part of the prior art that is already known in this country to a person of ordinary skill in the art.

SUMMARY

Exemplary embodiments provide a photo-detecting device having high photo-detection efficiency for light in a specific wavelength range, such as, a UV light wavelength range.

Exemplary embodiments provide a photo-detecting device including a light absorption layer with improved crystallinity and having high photo-detection efficiency for, for instance, UV light.

Exemplary embodiments provide a UV photo-detecting device having improved photo-detection characteristics with respect to UV light and capable of providing an accurate UV index.

According to exemplary embodiments, a UV photo-detecting device includes: a first nitride layer; a secondary light absorption layer disposed on the first nitride layer; a primary light absorption layer disposed on the secondary light absorption layer; and a Schottky junction layer disposed on the primary light absorption layer. The secondary light absorption layer includes a nitride layer having lower band-gap energy than the primary light absorption layer.

As described above, exemplary embodiments provide a photo-detecting device with relatively low responsivity to visible light by including a low-current blocking layer. Accordingly, the photo-detecting device may have an improved UV-to-visible rejection ratio and achieve improved photo-detection efficiency and reliability.

In addition, exemplary embodiments provide a photo-detecting device that includes a light absorption layer having improved crystallinity and may reduce a micro-current induced by reaction to visible light.

Further, exemplary embodiments provide a UV photo-detecting device including a primary light absorption layer and a secondary light absorption layer capable of absorbing light having a longer wavelength than the wavelength of light absorbed into the primary light absorption layer, thereby securing good reliability while reducing detection error frequency. In addition, since a wavelength responsivity curve of the UV photo-detecting device is substantially similar to an erythema curve, the UV photo-detecting device can provides a relatively accurate UV index by measuring UV light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and together with the description serve to explain the principles of the inventive concept.

DETAILED DESCRIPTION OF THE ILLUSTRATED EMBODIMENTS

Figure 1:
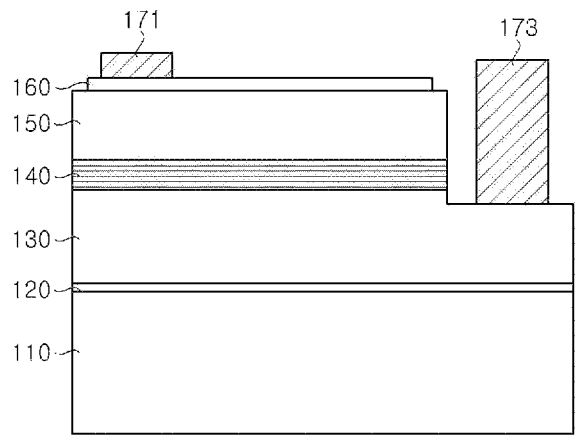
FIGS. 1 and 2 are, respectively, a sectional view and a top view of a photo-detecting device, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Illustrated as examples are composition ratios, growth methods, growth conditions, thicknesses, and the like, for semiconductor layers disclosed hereinafter, and the following descriptions do not limit the inventive concept disclosed herein. For example, for AlGaN, various composition ratios of Al and Ga may be used according to the need of those skilled in the art in the art. Furthermore, semiconductor layers disclosed hereinafter may be grown by various methods generally well-known to those skilled in the art, such as Metal Organic Chemical Vapor Deposition (MOCVD), Molecular Beam Epitaxy (MBE), Hydride Vapor Phase Epitaxy (HVPE), or the like. In the following exemplary embodiments, semiconductor layers are grown in the same chamber by MOCVD, and sources known to those skilled in the art according to composition ratios may be used as sources introduced into the chamber. However, it should be understood that the present invention is not limited thereto.

Figure 2:
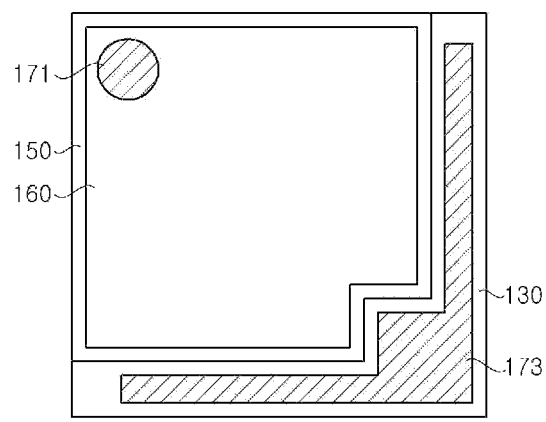

FIGS. 1 and 2 are, respectively, a sectional view and a top view of a photo-detecting device, according to exemplary embodiments.

Referring to FIGS. 1 and 2, a photo-detecting device includes a substrate 110, a first nitride layer 130, a low-current blocking layer 140, a light absorption layer 150, and a junction layer (e.g., Schottky junction layer) 160. In addition, the photo-detecting device may further include a second nitride layer 120, a first electrode 171, and a second electrode 173. Although specific reference will be made to this particular implementation, it is also contemplated that the photo-detecting device may embody many forms and include multiple and/or alternative components.

The substrate 110 is disposed at a lower side of the photo-detecting device, and any substrate enabling growth of semiconductor layers thereon may be used as the substrate 110. For example, the substrate 110 may include at least one of sapphire, SiC, ZnO, and a nitride-based substrate, such as GaN and AlN. As described, herein, the substrate 110 may include sapphire.

The first nitride layer 130 may be disposed on the substrate 110. The first nitride layer 130 may include a nitride-based semiconductor layer, for example, a GaN layer. The first nitride layer 130 may be doped with impurities, such as Si, to have n-type properties, or may be undoped. A nitride-based semiconductor may have characteristics of an n-type semiconductor even in an undoped state, and thus, doping of the nitride-based semiconductor may be determined as needed. When the first nitride layer 130 is doped with Si impurities to have n-type properties, a doping concentration of Si may be $1 \times 10^8$ or less. The first nitride layer 130 may have a thickness of about 2 μm.

The second nitride layer 120 may be disposed between the first nitride layer 130 and the substrate 110. The second nitride layer 120 may contain a substance similar to that of the first nitride layer 130, and, for example, may include GaN. The second nitride layer 120 may have a thickness of about 25 nm and may be grown at a lower temperature (for example, from 500° C. to 600° C.) than the first nitride layer 130. The second nitride layer 120 may serve to enhance crystallinity of the first nitride layer 130, whereby optical and electrical characteristics of the first nitride layer 130 may be improved by virtue of the second nitride layer 120. Further, when the substrate 110 is a heterogeneous substrate, such as a sapphire substrate, the second nitride layer 120 may also serve as a seed layer on which the first nitride layer 130 may be grown.

The low-current blocking layer 140 is disposed on the first nitride layer 130 and may have a multilayer structure. The multilayer structure of the low-current blocking layer 140 may include at least one of binary, ternary, and quaternary nitride semiconductor layers including (Al, In, Ga)N. Also, at least two nitride layers of the multilayer structure of the low-current blocking layer 140 may have different composition ratios than one another (or than at least one of the other layers of the multilayer structure). Each of the nitride layers may have a thickness of 5 nm to 10 nm, e.g., 6 nm to 9 nm, such as 7 nm to 8 nm. The multilayer structure of the low-current blocking layer 140 may have a structure in which three to ten pairs of nitride layers having different composition ratios are stacked.

Nitride semiconductor layers included in the multilayer structure of the low-current blocking layer 140 may be determined depending upon compositions of nitride layers in the light absorption layer 150. For example, when the light absorption layer 150 includes an AlGaN layer, the multilayer structure of the low-current blocking layer 140 may have a structure in which AlN/AlGaN layers and/or AlGaN/AlGaN layers are repetitively stacked. When the light absorption layer 150 includes an InGaN layer, the multilayer structure of the low-current blocking layer 140 may have a structure in which InGaN/InGaN layers, GaN/InGaN layers, and/or AlInGaN/AlInGaN layers are repetitively stacked, and when the light absorption layer 150 includes a GaN layer, the multilayer structure of the low-current blocking layer 140 may have a structure in which GaN/InGaN layers, InGaN/InGaN layers, and/or GaN/GaN layers are repetitively stacked.

Each of the nitride layers included in the low-current blocking layer 140 may have a different composition ratio by growing the nitride layers at different pressures. For example, if a multilayer structure of the low-current blocking layer 140 includes an $Al_xGa(1-x)N$ layer and an $Al_yGa(1-y)N$ layer repetitively stacked, the $Al_xGa(1-x)N$ layer may be grown at a pressure of about 100 Torr and the $Al_yGa(1-y)N$ layer may be grown at a pressure of about 400 Torr. When growth conditions are the same except for the pressure, the $Al_xGa(1-x)N$ layer grown at a lower pressure may have a higher Al ratio than the $Al_yGa(1-y)N$ layer grown at a higher pressure. It is contemplated, however, than any other suitable method may be utilized to control the various composition ratios of the various nitride layers.

According to exemplary embodiments, the nitride layers grown at different pressures may have different growth rates. As the nitride layers are grown at the different growth rates, it is possible to reduce propagation of dislocation or to change a propagation path of dislocation in the process of growth, thereby reducing dislocation concentration in other semiconductor layers to be grown in subsequent processes. Also, different composition ratios of the repetitively stacked layers may relieve stress caused by lattice mismatch, thereby enhancing crystallinity of the other semiconductor layers to be grown in the subsequent processes, and preventing damage such as cracks and the like. In particular, by growing an AlGaN layer having an Al ratio of 15% or more on the low-current blocking layer 140, cracks in the AlGaN layer may be reduced, thereby reducing cracks in the formation of the AlGaN layer on an AlN layer or a GaN layer. According to exemplary embodiments, since the low-current blocking layer 140 including the multilayer structure may be formed under the light absorption layer 150, the light absorption layer 150 may have enhanced crystallinity with reduced cracks therein. When the light absorption layer 150 has improved crystallinity, quantum efficiency of the photo-detecting device may be improved.

The low-current blocking layer 140 may have a higher defect concentration than the light absorption layer 150. This may be obtained by growing the low-current blocking layer 140 at a lower temperature than the light absorption layer 150.

For example, the light absorption layer 150 may be grown at a temperature of about 1050° C. and the low-current blocking layer 140 may be grown at a lower temperature than the light absorption layer 150 by 30° C. to 200° C., e.g., 70° C. to 160° C., such as 100° C. to 130° C. When the low-current blocking layer 140 is grown at a lower temperature than the light absorption layer 150 by more than 200° C., crystallinity of the light absorption layer 150 formed on the low-current blocking layer 140 may be rapidly degraded, thereby decreasing quantum efficiency of the light absorption layer 150. Thus, the low-current blocking layer 140 may be grown at a lower temperature than the light absorption layer 150 by 30° C. to 200° C. When the low-current blocking layer 140 is grown at a lower temperature than the light absorption layer 150, the low-current blocking layer 140 may have a relatively higher concentration of defects, such as dislocation and vacancy, than the light absorption layer 150. Low-current blocking of the low-current blocking layer 140 will be described below in detail.

Referring back to FIG. 1, the light absorption layer 150 may be disposed on the low-current blocking layer 140.

The light absorption layer 150 may include a nitride semiconductor layer, including at least one of, but not limited to, a GaN layer, an InGaN layer, an AlInGaN layer, and an AlGaN layer. Since an energy band gap of the nitride semiconductor layer is determined depending upon the type of Group III element utilized, a substance for a nitride semiconductor of the light absorption layer 150 may be determined depending on the wavelength(s) of light to be detected by the photo-detecting device. For example, a photo-detecting device for detecting UV light in the UVA band may include the light absorption layer 150 including a GaN layer or an InGaN layer. A photo-detecting device for detecting UV light in the UVB band may include the light absorption layer 150 including an AlGaN layer having an Al ratio of 28% or less, and a photo-detecting device for detecting UV light in the UVC band may include the light absorption layer 150 including an AlGaN layer having an Al ratio of 28% to 50%, e.g., 33% to 45%, such as 38% to 40%. However, it should be understood that the present invention is not limited thereto.

The light absorption layer 150 may have a thickness of about 0.1 μm to about 0.5 μm, and may be formed to a thickness of 0.1 μm or more to improve photo-detection efficiency. When the light absorption layer 150 is formed on an AlN layer or a GaN layer, the light absorption layer 150 may suffer from cracking when the light absorption layer 150 including an AlGaN layer having an Al ratio of 15% is formed to a thickness of 0.1 μm or more. As such, device manufacturing yield and photo-detection efficiency may be reduced from a thin thickness of 0.1 μm or less of the light absorption layer 150. In contrast, according to exemplary embodiments, the light absorption layer 150 may be formed on the low-current blocking layer 140 including the multilayer structure, such that cracks may be reduced in the light absorption layer 150. In this manner, thereby the light absorption layer 150 may be manufactured to have a thickness of 0.1 μm or more. Accordingly, the photo-detecting device according to the exemplary embodiments may have improved photo-detection efficiency.

The Schottky junction layer 160 may disposed on the light absorption layer 150. The Schottky junction layer 160 and the light absorption layer 150 may make Schottky-contact with each other, and the Schottky junction layer 160 may include at least one of indium tin oxide (ITO), Ni, Co, Pt, W, Ti, Pd, Ru, Cr, and Au. The thickness of the Schottky junction layer 160 may be adjusted in terms of light transmittance and Schottky characteristics, and may be, for example, 10 nm or less.

In addition, the photo-detecting device may further include a cap layer (not shown) between the Schottky junction layer 160 and the light absorption layer 150. The cap layer may be a p-type-doped nitride semiconductor layer containing one or more impurities, such as Mg. The cap layer may have a thickness of 100 nm or less, e.g., 5 nm or less. The cap layer may improve Schottky characteristics of the device.

Referring back to FIG. 1, the photo-detecting device may include an exposed region of the first nitride layer 130 that may be formed by partially removing the light absorption layer 150 and the low-current blocking layer 140. The second electrode 173 may be disposed on the exposed region of the first nitride layer 130, and the first electrode 171 may be disposed on the Schottky junction layer 160.

The first electrode 171 may be a metal electrode including multiple layers, and may be formed from any suitable material. For example, the first electrode 171 may include at least one of a Ni layer and an Au layer stacked. The second electrode 173 may form ohmic-contact with the first nitride layer 130 and may include multiple metal layers formed from any suitable material. For example, the second electrode 173 may include at least one of a Cr layer, a Ni layer, and an Au layer stacked. It is contemplated, however, that any other suitable formations may be utilized in association with exemplary embodiments described herein.

Hereinafter, a role of the low-current blocking layer 140 according to an operating principle of the exemplary photo-detecting device will be described.

With an external power source connected to the first electrode 171 and the second electrode 173 of the photo-detecting device, the photo-detecting device may be prepared in a state in which voltage is not applied thereto or backward voltage is applied thereto. When light is radiated to the prepared photo-detecting device, the light absorption layer 150 absorbs the light. When the Schottky junction layer 160 is formed on the light absorption layer 150, an electron-hole separation region, namely, a depletion region is formed at an interface therebetween. Electrons created by the radiated light may induce a current and a photo-detecting function may be performed by measuring the induced current.

For example, when the photo-detecting device is a UV light detecting device, an ideal UV light detecting device has an infinite UV-to-visible rejection ratio. However, according to a conventional UV light detecting device, a light absorption layer responds also to visible light due to defects in the light-absorption layer and generates electric current. Accordingly, the conventional photo-detecting device may have a UV-to-visible rejection ratio of 103 or less, thereby causing an error in the optical measurement.

In contrast, according to exemplary embodiments, the low-current blocking layer 140 captures electrons created by visible light in the light absorption layer 150 to decrease the error from the device driven by the visible light. As described above, the low-current blocking layer 140 is grown at a lower temperature than the light absorption layer 150 to have a higher defect concentration. Electrons created by visible light are much fewer than electrons created by UV light, thereby the movement of the electrons created by visible light may be captured by defects present in the low-current blocking layer 140. That is, the low-current blocking layer 140 has such a higher defect concentration than the light absorption layer 150, thereby capturing movement of the electrons created by the visible light. Since the electrons created by UV light radiated onto the light absorption layer 150 are much more than those created by visible light, current may flow in the device, without being captured by the low-current blocking layer 140. Accordingly, the photo-detecting device of exemplary embodiments may have a higher UV-to-visible rejection ratio than the conventional UV light detecting device due to low responsivity to visible light. In particular, the photo-detecting device according to exemplary embodiments may have a UV-to-visible rejection ratio of 104 or more. Therefore, the device may provide a photo-detecting device with high detection efficiency and reliability.

FIGS. 3, 4, 5, 6, 7, and 8 are sectional views of a photo-detecting device at various stages of manufacture, according to exemplary embodiments. Duplicative descriptions of the same components as those described with reference to FIGS. 1 and 2 will be omitted.

Figure 3:
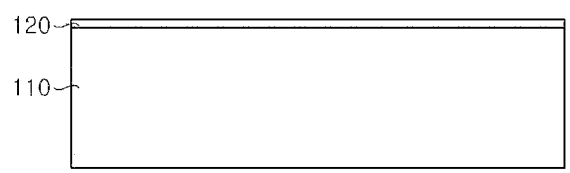
FIGS. 3, 4, 5, 6, 7, and 8 are sectional views of a photo-detecting device at various stages of manufacture, a photo-detecting device according to exemplary embodiments.

First, referring to FIG. 3, a second nitride layer 120 may be formed on a substrate 110. The second nitride layer 120 may include a nitride semiconductor and may be grown by MOCVD. For example, the second nitride layer 120 may be grown by injecting a Ga source and an N source into a chamber at 550° C. and 100 Torr. Accordingly, the second nitride layer 120 may include a GaN layer grown at low temperature. The second nitride layer 120 may be grown to a thickness of about 25 nm. The second nitride layer 120 grown to a small thickness at low temperature can provide improved crystallinity and optical and electrical characteristics to a first nitride layer 130 in the subsequent process.

Figure 4:
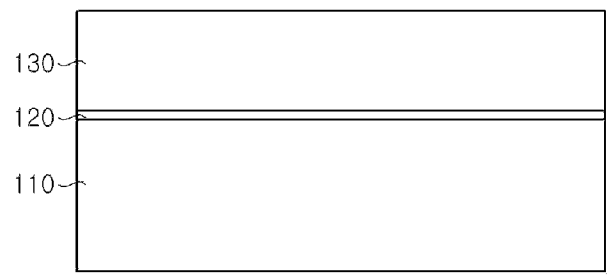

Next, referring to FIG. 4, the first nitride layer 130 is formed on the second nitride layer 120 by MOCVD. The first nitride layer 130 may include a nitride semiconductor and may be grown by MOCVD. For example, the first nitride layer 130 may be grown by injecting Ga source and N source into the chamber at 1050° C. and 100 Torr. In this manner, the first nitride layer 130 may include a GaN layer grown at high temperature. Furthermore, the first nitride layer 130 may include an n-type-doped GaN layer obtained by injecting an additional Si source into the chamber during growth of the first nitride layer 130, or may include an undoped GaN layer. The first nitride layer 130 may be grown with a thickness of about 2 μm.

Figure 5:
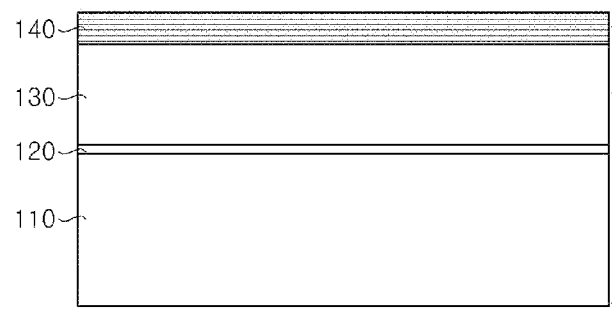

Referring to FIG. 5, a low-current blocking layer 140 is formed on the first nitride layer 130. The low-current blocking layer 140 may include a multilayer structure. Here, the multilayer structure may be formed by repetitively stacking at least one of binary, ternary, and quaternary nitride layers including (Al, In, Ga)N.

In exemplary embodiments, the multilayer structure of the low-current blocking layer 140 may include at least two nitride layers having different composition ratios. The nitride layers included in the multilayer structure of the low-current blocking layer 140 may be determined depending upon compositions of a nitride layer to be included in a light absorption layer 150. For example, when the light absorption layer 150 is to include an AlGaN layer, the multilayer structure of the low-current blocking layer 140 may have a structure in which AlN/AlGaN layers and/or AlGaN/AlGaN layers are repetitively stacked. When the light absorption layer 150 is to include an InGaN layer, the multilayer structure of the low-current blocking layer 140 may have a structure in which InGaN/InGaN layers, GaN/InGaN layers, and/or AlInGaN/AlInGaN layers are repetitively stacked. When the light absorption layer 150 is to include a GaN layer, the multilayer structure of the low-current blocking layer 140 may have a structure in which GaN/InGaN layers, InGaN/InGaN layers, and/or GaN/GaN layers are repetitively stacked. The multilayer structure of the low-current blocking layer 140 may be formed by stacking three to ten pairs of nitride layers, and the low-current blocking layer 140 may be formed to have a thickness of 10 nm to 100 nm.

Each of the at least two nitride layers having different composition ratios may be grown to a thickness of 5 nm to 10 nm, and may be grown to have a different composition ratio by regulating an inflow rate of a source. It is also contemplated that the at least two nitride layers having different composition ratios may be formed by stacking nitride layers at different pressures of the chamber while preserving other growth conditions (e.g. growth temperature) including the inflow rates of the sources. For example, when forming a multilayer structure in which an AlxGa(1−x)N layer and an AlyGa(1−y)N layer are repetitively stacked, the AlxGa(1−x)N layer may be grown at a pressure of about 100 Torr and the AlyGa(1−y)N layer may be grown at a pressure of about 400 Torr. Under the same growth conditions except for the pressure, the AlxGa(1−x)N layer grown at a lower pressure may have a higher Al ratio than the AlyGa(1−y)N layer grown at a higher pressure.

According to exemplary embodiments, the low-current blocking layer 140 including the multilayer structure grown at different pressures as described above may prevent (or otherwise reduce) the creation and propagation of dislocations during the growth process, thereby improving the crystallinity of the light absorption layer 150 formed on the low-current blocking layer 140. Furthermore, since the nitride layers grown at different pressures having different composition ratios are repetitively stacked, the stress caused, at least in part, by lattice mismatch may be decreased, thereby also reducing the generation of cracks in the light absorption layer 150. Moreover, since the nitride layers are grown by changing only the pressure while preserving the inflow rate of the source, it may be relatively easy to form the low-current blocking layer 140.

The multilayer structure of the low-current blocking layer 140 may be grown at a temperature between 850° C. and 1020° C. The growth temperature of the multilayer structure of the low-current blocking layer 140 may be 30° C. to 200° C. lower than that of the light absorption layer 150, and, therefore, the low-current blocking layer 140 can have a higher defect concentration than that of the light absorption layer 150. Accordingly, the low-current blocking layer 140 may capture the flow of electrons created by a reaction of the light absorption layer 150 to visible light.

Figure 6:
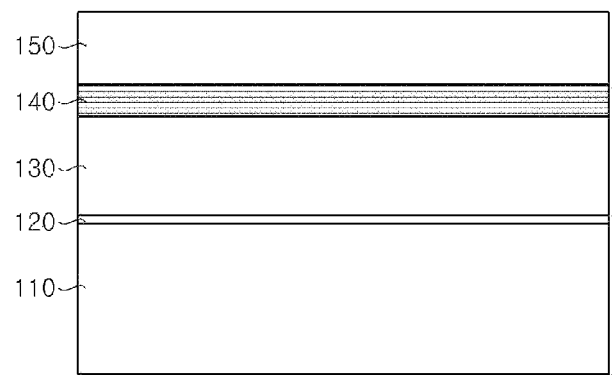

Referring to FIG. 6, the light absorption layer 150 is formed on the low-current blocking layer 140. The light absorption layer 150 may include a nitride semiconductor and may be grown by selectively applying elements and compositions of the nitride semiconductor depending upon a wavelength of light to be detected by the photo-detecting device. For example, the light absorption layer 150 including a GaN layer or an InGaN layer may be grown for a photo-detecting device configured to detect UV light in the UVA band. The light absorption layer 150 including an AlGaN layer having an Al ratio of 28% or less may be grown for a photo-detecting device configured to detect UV light in the UVB band. The light absorption layer 150 including an AlGaN layer having an Al ratio of 28% to 50% may be grown for a photo-detecting device configured to detect UV light in the UVC band. It is contemplated, however, that exemplary embodiments are not limited thereto.

In exemplary embodiments, the light absorption layer 150 may be grown to a thickness of 0.1 μm or more, and thus the manufactured photo-detecting device may have improved photo-detection efficiency.

Figure 7:
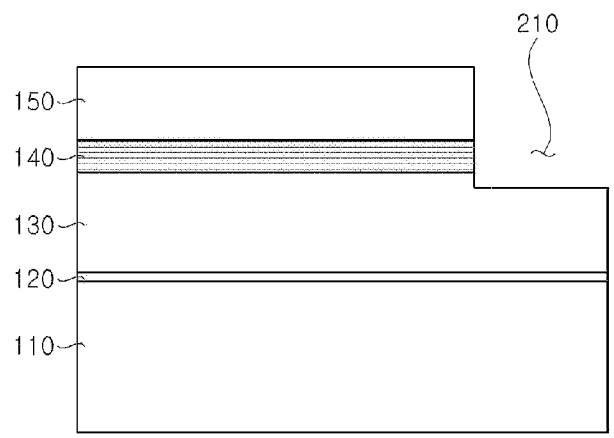

Referring to FIG. 7, the first nitride layer 130 may be partially exposed by partially removing the light absorption layer 150 and the low-current blocking layer 140. In addition, a portion of the first nitride layer 130 under the exposed portion may be further removed in a thickness direction.

The light absorption layer 150 and the low-current blocking layer 140 may be partially removed by photolithography and etching, for example, dry etching. It is contemplated, however, that any other suitable methodology may be utilized in association with exemplary embodiments described herein.

Figure 8:
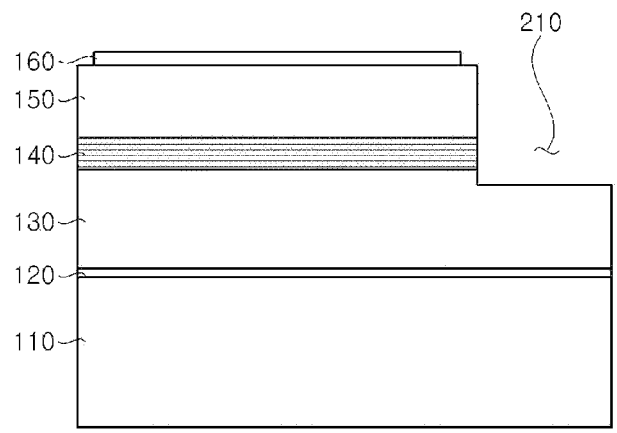

Referring to FIG. 8, a Schottky junction layer 160 is formed on the light absorption layer 150. The Schottky junction layer 160 may be formed by deposition (or other formation) of a substance including at least one of ITO, Ni, Co, Pt, W, Ti, Pd, Ru, Cr, and Au. The thickness of the Schottky junction layer 160 may be adjusted in terms of light transmittance and Schottky characteristics, and, may be, for example, 10 nm or less in thickness.

In addition, the manufacturing method may further include forming a cap layer (not shown) between the Schottky junction layer 160 and the light absorption layer 150. The cap layer may be formed by growing a p-type-doped nitride semiconductor layer containing an impurity such as, for example, Mg. The cap layer may have a thickness of 100 nm or less, such as, 5 nm or less. The cap layer may improve the Schottky characteristics of the device.

Next, a first electrode 171 and a second electrode 173 are formed on the Schottky junction layer 160 and the exposed area of the first nitride layer 130, respectively, as seen in FIG. 1. The first and second electrodes 171 and 173 may be formed by deposition (or other formation) of metallic materials and lift-off, and may also be composed of multiple layers. For example, the first electrode 171 may be formed by stacking at least one of Ni and Au layers, and the second electrode 173 may be formed by stacking at least one of Cr, Ni, and Au layers. It is contemplated, however, that exemplary embodiments are not limited thereto.

Figure 9:
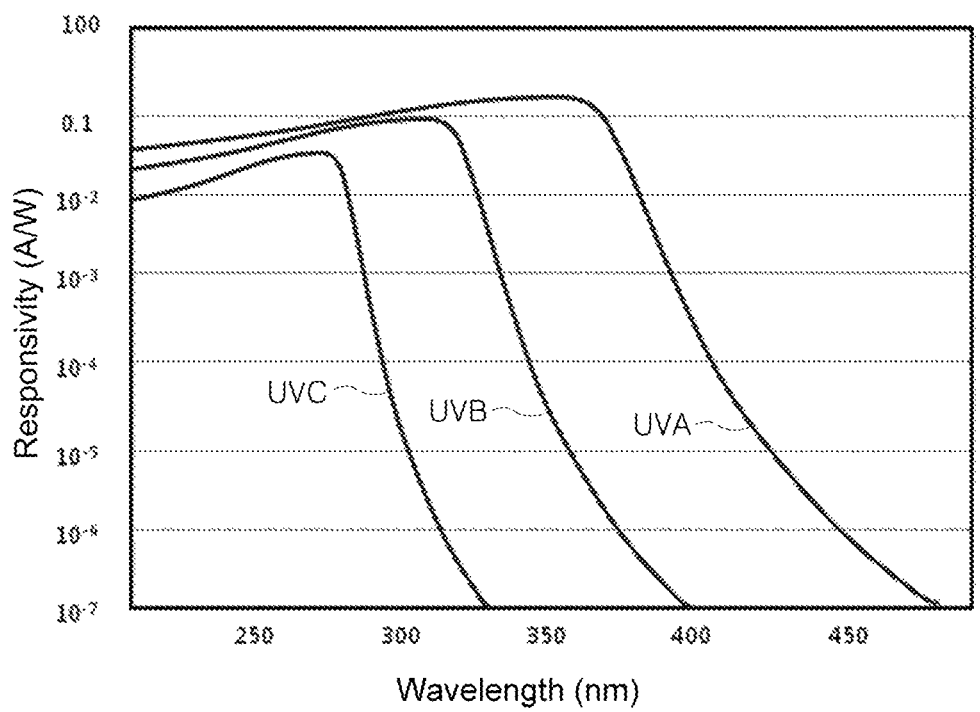
FIG. 9 is a graph comparing characteristics of a photo-detecting device, according to exemplary embodiments.

FIG. 9 is a graph comparing responsivity of photo-detecting devices depending upon wavelengths, according to exemplary embodiments. The photo-detecting devices used in FIG. 9 include features of the exemplary embodiments described herein. The UVA photo-detecting device includes a GaN layer as the light-absorption layer 150, the UVB photo-detecting device includes an AlGaN layer having an Al ratio of 28% as the light-absorption layer 150, and the UVC photo-detecting device includes an AlGaN layer having an Al ratio of 50% as the light-absorption layer 150.

The photo-detecting devices have high responsivity, as shown in FIG. 9. UV-to-visible light rejection ratios of the photo-detecting devices are calculated on the basis of measurement results on responsivity obtained by illuminating the photo-detecting devices with a white LED having a peak wavelength of 600 nm, and the calculation results show that all of these photo-detecting devices have UV-to-visible light rejection ratios of 104 or higher.

Figure 10:
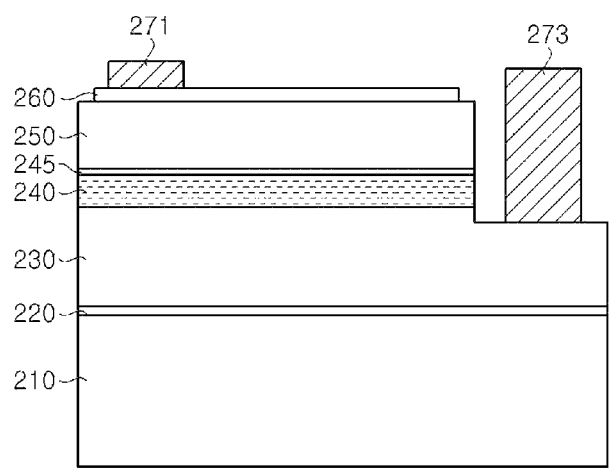
FIGS. 10 and 11 are, respectively, a sectional view and a plan view of a UV photo-detecting device, according to exemplary embodiments.
Figure 11:
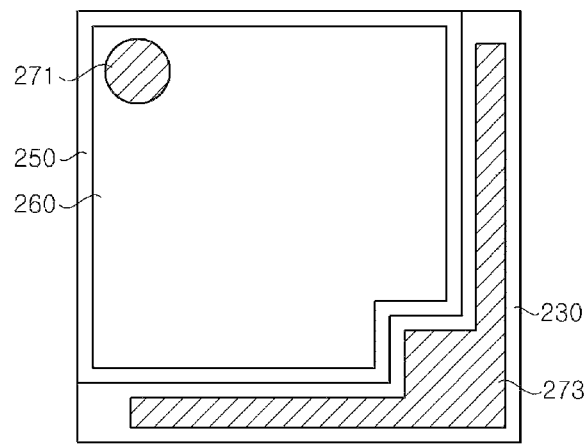

FIG. 10 and FIG. 11 are, respectively, a sectional view and a plan view of a UV photo-detecting device, according to exemplary embodiments.

Referring to FIG. 10 and FIG. 11, the UV photo-detecting device includes a substrate 210, a first nitride layer 230, a secondary light absorption layer 240, a primary light absorption layer 250, and a junction layer (e.g., a Schottky junction layer) 260. In addition, the UV photo-detecting device may further include a second nitride layer 220, a first delta layer 245, a first electrode 271, and a second electrode 273. Although specific reference will be made to this particular implementation, it is also contemplated that the UV photo-detecting device may embody many forms and include multiple and/or alternative components.

The substrate 210 is disposed at a lower side of the photo-detecting device, and any substrate enabling growth of semiconductor layers thereon may be used as the substrate 210. For example, the substrate 210 may include at least one of, but not limited to, sapphire, SiC, ZnO, and a nitride-based substrate, such as GaN or AlN. For the purposes of explanation, the substrate 210 is a sapphire substrate.

The first nitride layer 230 may be disposed on the substrate 210. The first nitride layer 230 may include a nitride-based semiconductor layer, for example, a GaN layer. The first nitride layer 230 may be doped with impurities, such as Si, to have n-type conductivity, or may be undoped. A nitride-based semiconductor may have characteristics of an n-type semiconductor even in an undoped state, and, thus, doping of the nitride-based semiconductor may be utilized as desired. When the first nitride layer 130 is doped with Si impurities to have n-type conductivity, a doping concentration of Si may be $1\times10^8$ or less. The first nitride layer 230 may have a thickness of about 2 μm.

The first nitride layer 230 may be grown at a relatively high temperature. For example, the first nitride layer 230 may be grown by injecting a Ga source and an N source into a MOCVD chamber at a temperature of about 1050° C. and a pressure of about 100 Torr.

The first nitride layer 230 may include an upper surface that may be partially exposed, and the second electrode 273 may be disposed on the exposed region of the first nitride layer 230. The second nitride layer 220 may be disposed between the first nitride layer 230 and the substrate 210. The second nitride layer 220 may include a material similar to the first nitride layer 230, for example, a GaN layer. It is contemplated, however, that any suitable material may be utilized in association with exemplary embodiments disclosed herein.

The second nitride layer 220 may have a thickness of about 25 nm and may be grown at a lower temperature than the first nitride layer 230. The second nitride layer 220 may be grown by MOCVD. For example, the second nitride layer 220 may be grown by injecting a Ga source and an N source into a chamber at a temperature about 550° C. and about a pressure 100 Torr. The second nitride layer 220 grown at a relatively low temperature may enhance crystallinity of the first nitride layer 230. Accordingly, the second nitride layer 220 disposed between the substrate 210 and the first nitride layer 230 may improve optical and electrical characteristics of the first nitride layer 230. Further, when the substrate 210 is a heterogeneous substrate, such as a sapphire substrate, the second nitride layer 220 may also serve as a seed layer on which the first nitride layer 230 may be grown.

The secondary light absorption layer 240, the primary light absorption layer 250, and the first delta layer 245 may be disposed on a part of the upper surface of the first nitride layer 230, and will hereinafter be described in more detail.

First, the primary light absorption layer 250 may be disposed on the secondary light absorption layer 240. The primary light absorption layer 250 may provide a main region in which a depletion layer is formed, and, thus, a wavelength of light detected by the depletion layer may be determined by an elemental composition and thickness of the primary light absorption layer 250. The primary light absorption layer 250 may be grown by MOCVD. The primary light absorption layer 250 may include a nitride semiconductor layer, such as, a nitride semiconductor including Al. Since the energy bandgap of the nitride semiconductor layer is determined based on the kind of Group III element included in the nitride semiconductor layer, a nitride semiconductor material of the primary light absorption layer 250 may be determined in consideration of the wavelength of light to be detected by the photo-detecting device. The primary light absorption layer 250 may include, for example, an $Al_xGa_{(1-x)}N$ layer ($0<x<1$), which may have band-gap energy corresponding to a wavelength of 295 nm to 310 nm. In this manner, wavelength responsivity of the UV photo-detecting device with respect to light having a wavelength of about 300 nm to about 320 nm may be substantially the same as an erythema curve.

Further, the primary light absorption layer 250 may have a multilayer structure. The multilayer structure may include a plurality of AlGaN layers, the Al ratio of which may gradually increase in a downward direction. That is, in the plural AlGaN layers, an AlGaN layer placed at an upper side may absorb light having a shorter wavelength than an AlGaN layer placed at a lower side. For example, the multilayer structure may include on the $Al_xGa_{(1-x)}N$ layer ($0<x<1$) and an $Al_yGa_{(1-y)}N$ layer ($0<y<1$), where x may be less than y. In this manner, the wavelength responsivity of the primary light absorption layer 250 according to wavelength may be adjusted to be more similar to the erythema curve. Exemplary embodiments, however, are not limited thereto, and the multilayer structure may include three or more layers, etc., and the Al ratio of which may sequentially increase or decrease.

The primary light absorption layer 250 may have a thickness of about 50 nm to about 200 nm, e.g., about 75 nm to about 175 nm, such as about 100 nm to about 150 nm. With this thickness, the primary light absorption layer 250 may enhance photo-detection efficiency and exhibit improved crystallinity while allowing the secondary light absorption layer 240 to absorb light. Specifically, when the thickness of the primary light absorption layer 250 is less than 50 nm, the primary light absorption layer 250 can suffer from deterioration in photo-detection efficiency due to a thin thickness thereof. When the thickness of the primary light absorption layer 250 exceeds 200 nm, cracks may be created in the primary light absorption layer 250 upon increasing the Al ratio, and the depletion layer may not expand to the secondary light absorption layer 240, whereby the secondary light absorption layer 240 may not function as a photo-detection region. Exemplary embodiments, however, are not limited thereto.

The secondary light absorption layer 240 may be disposed between the first nitride layer 230 and the primary light absorption layer 250. The secondary light absorption layer 240 may include at least one of binary, ternary, and quaternary nitride semiconductor layers including (Al, In, Ga)N, and may include a nitride semiconductor layer, which has a lower band-gap energy than the primary light absorption layer 250. For example, when the primary light absorption layer 250 includes $Al_yGa_{(1-y)}N$ layer ($0<y<1$, $x<y$), which has a lower Al ratio than the $Al_xGa_{(1-x)}N$ layer. Thus, the secondary light absorption layer 240 may absorb light having a longer wavelength, such as, in a wavelength of about 320 nm to 395 nm, than the primary light absorption layer 250.

The secondary light absorption layer 240 may have a thickness of about 60 nm to about 100 nm, e.g., about 70 nm to about 90 nm, such as about 79 nm to about 81 nm. When the thickness of the secondary light absorption layer 240 is less than 60 nm, the depletion layer may expand to the first nitride layer 230, whereby the UV photo-detecting device may detect visible light. In this manner, the UV photo-detecting device may suffer from deterioration in reliability.

According to exemplary embodiments, the depletion layer may be formed not only in the primary light absorption layer 250, but also in the secondary light absorption layer 240, whereby the primary light absorption layer 250 and the secondary light absorption layer 240 may participate in photo-detection. Here, as described above, the secondary light absorption layer 240 may include the nitride semiconductor layer having lower band-gap energy than the primary light absorption layer 250, and, as such, may have a relatively high responsivity with respect to light in a wavelength of about 320 nm to about 395 nm. To this end, for light in UV A and UV B bands, the wavelength responsivity curve of the UV photo-detecting device may be substantially similar to the erythema curve.

In exemplary embodiments, the UV photo-detecting device may have more accurate and better photo-detection characteristics than typical photo-detecting devices. For instance, since the wavelength responsivity curve of the UV photo-detecting device may be substantially similar to the erythema curve, the UV photo-detecting device may have relatively high reliability. Further, it is possible to obtain a relatively accurate UV index by calculating energy of UV light detected using the UV photo-detecting device, according to the exemplary embodiments. Further, the secondary light absorption layer 240 may include a multilayer structure layer, which may include at least one nitride semiconductor layer having lower band-gap energy than the primary light absorption layer 250. The multilayer structure layer may have a structure in which at least 10 nitride semiconductor layers having different compositions and/or different materials are repetitively and/or alternately stacked.

The multilayer structure layer may include at least one structure in which AlGaN/AlGaN layers, AlGaN/GaN layers, AlGaN/InGaN layers, and AlGaN/AlInGaN layers are repetitively and/or alternately stacked. Further, the multilayer structure layer may include a structure, the composition of which is continuously changed. For example, the multilayer structure layer may include layers, the Al ratio of which gradually decreases in the downward direction. For instance, the multilayer structure layer may include an $Al_xGa_{(1-x)}N$ layer ($0<x<1$) and an $Al_yGa_{(1-y)}N$ layer ($0<y<1$) disposed on the $Al_xGa_{(1-x)}N$ layer, where x may be less than y. It is also contemplated that the multilayer structure layer may include three or more layers, which are repetitively and/or alternately stacked one above another, such that the Al ratio of a layer at a relatively lower side of the multilayer structure layer is lower than that of a layer at a relatively upper side thereof.

In addition, the multilayer structure layer may further include a second delta layer (not shown) disposed between the stacked layers. The second delta layer may be selectively disposed between different layers of the multilayer structure layer. Further, the Al ratio of the second delta layer may be higher than that of other layers of the secondary light absorption layer 240. The second delta layer may include a nitride semiconductor layer having a higher Al ratio, and may have higher band-gap energy than other layers adjacent to the second delta layer. For example, in the multilayer structure layer formed by alternately stacking $Al_xGa_{(1-x)}N$ ($0<x<1$) and $Al_yGa_{(1-y)}N$ layers ($0<y<1$, $y<x$) one above another, the second delta layer may be disposed between the $Al_xGa_{(1-x)}N$ layer and the $Al_yGa_{(1-y)}N$ layer. Also, the Al ratio of the second delta layer may be higher than those of the $Al_xGa_{(1-x)}N$ layer and the $Al_yGa_{(1-y)}N$ layer, whereby the band-gap energy of the second delta layer may also be higher than those of the $Al_xGa_{(1-x)}N$ layer and the $Al_yGa_{(1-x)}N$ layer.

According to exemplary embodiments, a two-dimensional electron gas (2DEG) may be created (or otherwise generated) around an interface between the second delta layer and the other layers of the multilayer structure layer. In this manner, carriers (e.g., electrons) may be more effectively spread in the horizontal direction. As the carriers are widely spread in the horizontal direction, efficiency of the UV photo-detecting device may be improved.

It is also contemplated that the second delta layer may be selectively formed in the multilayer structure layer. When the multilayer structure layer includes a layer having a higher Al ratio and a layer having a lower Al ratio, the second delta layer may be disposed on the layer having a higher Al ratio, while the second delta layer is not disposed under the layer having a higher Al ratio. For example, in a multilayer structure layer including alternately stacked layers of $Al_xGa_{(1-x)}N$ (0<x<1) and AlyGa(1-y) (0<y<1, y<x), the second delta layer may be disposed on the $Al_yGa_{(1-y)}N$ layer and under the $Al_xGa_{(1-x)}N$ layer without being disposed under the $Al_yGa_{(1-y)}N$ layer. In this manner, the two-dimensional electron gas (2DEG) created by the second delta layer may be formed within the $Al_yGa_{(1-y)}N$ layer having a relatively high Al ratio.

The second delta layer may have a thickness of, for example, several Å to several nm, without being limited thereto.

The Al ratio and the band-gap of the second delta layer may increase linearly or non-linearly from the first nitride layer 230 to the primary light absorption layer 250. Increase in the Al ratio in the thickness direction may be accomplished by growing the second delta layer through increasing the supply of an Al source, such as TMAl, or through heat treatment under conditions that the Al source remains in a chamber. Any other suitable method may be utilized in association with exemplary embodiments described herein. Efficiency in two-dimensional spreading of the carriers may be improved by increasing the Al ratio of the second delta layer to increase the band-gap energy of the second delta layer while decreasing the thickness of the second delta layer. Furthermore, generation of dislocations may be prevented (or otherwise reduced) at an interface between the second delta layer and the other semiconductor layers, thereby preventing (or otherwise reducing) deterioration in crystallinity of the primary light absorption layer 250 due to dislocations.

The layers of the multilayer structure layer may be grown by MOCVD. In this manner, layers of the multilayer structure layer having different composition ratios may be formed by changing pressure without changing other growth conditions upon growth of the multilayer structure layer. Nitride layers grown at different pressures may have different growth rates. As the nitride layers are grown at different growth rates, it may be possible to suppress propagation of dislocations or to change a propagation path of dislocations in the process of growth, thereby reducing dislocation concentration in other semiconductor layers to be grown by subsequent processes. Furthermore, different composition ratios of the repetitively and/or alternately stacked layers may relieve stress caused by lattice mismatch, thereby enhancing crystallinity of the other semiconductor layers to be grown in the subsequent processes, and preventing (or otherwise reducing) damage, such as cracks, and the like. For instance, when the primary light absorption layer 250 including an AlGaN layer having an Al ratio of 15% or more is grown on the secondary light absorption layer 240, it is possible to effectively prevent formation of cracks in the AlGaN layer.

According to exemplary embodiments, the secondary light absorption layer 240 including the multilayer structure layer may further improve crystallinity of the primary light absorption layer 250 while preventing damage, such as cracks, and the like, to the primary light absorption layer 250, thereby improving reliability and efficiency of the photo-detecting device.

The first delta layer 245 may be disposed between the secondary light absorption layer 240 and the primary light absorption layer 250. The first delta layer 245 may include at least one of binary, ternary, and quaternary nitride semiconductor layers including (Al, In, Ga)N, for example, AlGaN or AlN. For instance, the first delta layer 245 may include a nitride semiconductor layer having a relatively high Al ratio. That is, the first delta layer 245 may have higher band-gap energy than the secondary light absorption layer 240 and/or the primary light absorption layer 250.

In exemplary embodiments, the first delta layer 245 may include Al in a higher ratio than average Al ratios of the primary light absorption layer 250 and the secondary light absorption layer 240. In this manner, a two-dimensional electron gas (2DEG) may be created (or otherwise generated) around an interface between the first delta layer 245 and the secondary light absorption layer 240, thereby carriers (e.g., electrons) may be more effectively spread in the horizontal direction. As the carriers are widely spread in the horizontal direction, efficiency of the UV photo-detecting device may be improved.

Although the thickness of the first delta layer 245 is not limited, the first delta layer 245 may be formed to a thickness that upward or downward migration of carriers is not restricted by the first delta layer 245. That is, the thickness of the first delta layer 245 may be determined to allow migration of carriers by a tunneling effect, for example, in the range of several Å to several nm. In addition, the Al ratio of the first delta layer 245 may vary. For example, the Al ratio of the first delta layer 245 may increase linearly or non-linearly from the secondary light absorption layer 240 and the primary light absorption layer 250. Further, when the secondary light absorption layer 240 including a multilayer structure layer having different Al ratios is formed, a layer having a relatively high Al ratio may be disposed in the uppermost region of the secondary light absorption layer 240. In this manner, the layer having a relatively high Al ratio in the secondary light absorption layer 240 may adjoin (or abut) the first delta layer 245, thereby further enhancing carrier spreading by the two-dimensional electron gas.

The junction (e.g., Schottky junction) layer 260 may be disposed on the primary light absorption layer 250. Hereinafter, the junction layer 260 will be referred to as a Schottky junction layer 260. The Schottky junction layer 260 and the primary light absorption layer 250 may form Schottky contact with each other, and the Schottky junction layer 260 may include at least one of ITO, Ni, Co, Pt, W, Ti, Pd, Ru, Cr, and Au. The thickness of the Schottky junction layer 260 may be adjusted in terms of light transmittance and Schottky characteristics, and may be formed to, for example, a thickness of 10 nm or less.

In addition, the photo-detecting device may further include a cap layer (not shown) between the Schottky junction layer 260 and the primary light absorption layer 250. The cap layer (not shown) may be formed by growing a p-type-doped nitride semiconductor layer containing an impurity such as Mg. The cap layer may have a thickness of 100 nm or less, for example, 5 nm or less. The cap layer may improve the Schottky characteristics of the device.

With continued reference to FIG. 10 and FIG. 11, the UV photo-detecting device, according to exemplary embodiments, may include an exposed region formed on a surface of the first nitride layer 230 by partially removing the primary light absorption layer 250 and the secondary light absorption layer 240. The second electrode 273 may be disposed on the exposed region of the first nitride layer 230 and the first electrode 271 may be disposed on the Schottky junction layer 260.

The first electrode 271 may include metal and may have a multilayer structure. For example, the first electrode 271 may be formed by stacking Ni and Au layers; however, any other suitable materials may be utilized in association with exemplary embodiments described herein. The second electrode 273 may form ohmic contact with the first nitride layer 230 and may have a multilayer structure including metal. For example, the second electrode 273 may be formed by stacking Cr, Ni, and Au layers; however, any other suitable materials may be utilized in association with exemplary embodiments described herein. It is also contemplated that any other suitable formations may be utilized in association with exemplary embodiments described herein.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An ultraviolet (UV) photo-detecting device, comprising:
   a first nitride layer;
   a secondary light absorption layer disposed on the first nitride layer;
   a primary light absorption layer disposed on the secondary light absorption layer; and
   a Schottky junction layer disposed on the primary light absorption layer,
   wherein the secondary light absorption layer comprises a nitride layer having lower band-gap energy than the primary light absorption layer.

2. The UV photo-detecting device of claim 1, wherein:
   the secondary light absorption layer comprises a multilayered structure; and
   the multilayer structure comprises at least one AlGaN layer.

3. The UV photo-detecting device of claim 2, wherein the multilayer structure further comprises nitride layers having different composition ratios, which are alternately stacked at least 10 times.

4. The UV photo-detecting device of claim 2, wherein the multilayer structure comprises an $Al_xGa(1-x)N$ layer ($0<x<1$) and an $Al_yGa(1-y)N$ layer ($0<y<1$, $y<x$) disposed on the $Al_xGa(1-x)N$ layer.

5. The UV photo-detecting device of claim 2, wherein:
   the secondary light absorption layer further comprises at least one second delta layer selectively disposed between layers of the multilayer structure; and
   the second delta layer has a higher Al ratio than other layers in the secondary light absorption layer.

6. The UV photo-detecting device of claim 5, wherein:
   the multilayer structure comprises:
   an $Al_xGa(1-x)N$ layer ($0<x<1$); and
   an $Al_yGa(1-y)N$ layer ($0<y<1$, $y<x$) disposed on the $Al_xGa(1-x)N$ layer; and
   the second delta layer is disposed between the $Al_xGa(1-x)N$ layer and the $Al_yGa(1-y)N$ layer.

7. The UV photo-detecting device of claim 6, wherein:
   the multilayer structure comprises alternately stacked layers of the $Al_xGa(1-x)N$ layer and the $Al_yGa(1-y)N$ layer; and
   the second delta layer is disposed on at least one of the $Al_yGa(1-y)N$ layers and not disposed directly on the $Al_xGa(1-x)N$ layers.

8. The UV photo-detecting device of claim 5, wherein:
   the secondary light absorption layer comprises a plurality of second delta layers; and
   the plurality of second delta layers have an Al ratio increasing in a direction from the first nitride layer towards the primary light absorption layer.

9. The UV photo-detecting device of claim 1, wherein the secondary light absorption layer is configured to absorb light in a wavelength of 320 nm to 395 nm.

10. The UV photo-detecting device of claim 1, wherein:
    the primary light absorption layer comprises a multilayer structure; and
    the multilayer structure comprises an $Al_xGa(1-x)N$ layer ($0<x<1$) and an $Al_yGa(1-y)N$ layer ($0<y<1$, $y<x$) disposed on the $Al_xGa(1-x)N$ layer.

11. The UV photo-detecting device of claim 1, further comprising:
    a cap layer disposed between the primary light absorption layer and the Schottky junction layer,
    wherein the cap layer comprises an Mg-doped nitride layer.

12. The UV photo-detecting device of claim 1, further comprising:
    a first delta layer disposed between the primary light absorption layer and the secondary light absorption layer,
    wherein the first delta layer has a higher Al ratio than average Al ratios of the primary light absorption layer and the secondary light absorption layer, and
    wherein the first delta layer has a thickness greater than 0 nm and less than 10 nm.

13. The UV photo-detecting device of claim 12, wherein the first delta layer has an Al ratio increasing in a direction from the first nitride layer towards the primary light absorption layer.

* * * * *